(12) United States Patent
Wang et al.

(10) Patent No.: US 11,563,201 B2
(45) Date of Patent: Jan. 24, 2023

(54) DISPLAY SUBSTRATE AND METHOD FOR MANUFACTURING THE SAME

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Ge Wang, Beijing (CN); Zhiliang Jiang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 790 days.

(21) Appl. No.: 16/343,673

(22) PCT Filed: Oct. 29, 2018

(86) PCT No.: PCT/CN2018/112387
§ 371 (c)(1),
(2) Date: Apr. 19, 2019

(87) PCT Pub. No.: WO2019/114438
PCT Pub. Date: Jun. 20, 2019

(65) Prior Publication Data
US 2021/0376299 A1 Dec. 2, 2021

(30) Foreign Application Priority Data
Dec. 14, 2017 (CN) .......................... 201711337825.2

(51) Int. Cl.
*H01L 21/31* (2006.01)
*H01L 51/56* (2006.01)
(Continued)

(52) U.S. Cl.
CPC .......... *H01L 51/56* (2013.01); *H01L 51/5253* (2013.01); *H01L 51/0097* (2013.01); *H01L 2251/5338* (2013.01)

(58) Field of Classification Search
None
See application file for complete search history.

(56) References Cited

U.S. PATENT DOCUMENTS

| 8,969,906 B2 * | 3/2015 | Yamazaki ........... H01L 27/1274 |
| | | 257/99 |
| 9,420,681 B1 * | 8/2016 | Huang .................... G06F 3/041 |
| 2018/0085976 A1 | 3/2018 | Fan et al. |

FOREIGN PATENT DOCUMENTS

| CN | 104699300 A | 6/2015 |
| CN | 105572941 A | 5/2016 |

(Continued)

OTHER PUBLICATIONS

International Search Report dated Jan. 28, 2019 issued in corresponding International Application No. PCT/CN2018/112387.
(Continued)

*Primary Examiner* — Hung K Vu
(74) *Attorney, Agent, or Firm* — Nath Goldberg & Meyer; Joshua R Goldberg

(57) ABSTRACT

A display substrate and a method for manufacturing the same are provided. The display substrate includes a base substrate and a display element provided on the base substrate. The method includes steps of forming a first protection layer at at least one of outer peripheral sides of the base substrate, and removing the first protection layer before attaching a cover plate to the base substrate on which the display element is provided.

8 Claims, 3 Drawing Sheets

(51) Int. Cl.
*H01L 51/52* (2006.01)
*H01L 51/00* (2006.01)

(56) References Cited

FOREIGN PATENT DOCUMENTS

| | | |
|---|---|---|
| CN | 106450043 A | 2/2017 |
| CN | 107464824 A | 12/2017 |
| CN | 108054142 A | 5/2018 |
| JP | 2017216108 A | 12/2017 |

OTHER PUBLICATIONS

First Office Action dated Jan. 20, 2020, for CN201711337825.2, with English translation.

* cited by examiner

DISPLAY SUBSTRATE AND METHOD FOR MANUFACTURING THE SAME

CROSS-REFERENCE TO RELATED APPLICATIONS

This is a National Phase application filed under 35 U.S.C. 371 as a national stage of PCT/CN2018/112387, filed Oct. 29, 2018, an application claiming the benefit of Chinese Application No. 201711337825.2, filed Dec. 14, 2017, the content of each of which is hereby incorporated by reference in its entirety.

TECHNICAL FIELD

The present disclosure relates to the field of display technology, and in particular, relates to a display substrate and a method for manufacturing the same.

BACKGROUND

During a manufacturing process of an organic light-emitting diode (OLED) display panel, a base substrate of the OLED display panel is prone to crack due to an external shock when it is cut, and a crack may extend from an edge region to a display region of the display panel in horizontal and vertical directions, causing infiltration of water and oxygen, thereby shortening the service life of the OLED display panel.

SUMMARY

According to an aspect of the present disclosure, there is provided a method for manufacturing a display substrate, the display substrate including a base substrate and a display element provided on the base substrate, the method including steps of forming a first protection layer at at least one of outer peripheral sides of the base substrate; and removing the first protection layer before attaching a cover plate to the base substrate on which the display element is provided.

In some embodiments, the method further includes a step of forming a second protection layer, which covers the display element, on the base substrate, before the step of forming a first protection layer at at least one of outer peripheral sides of the base substrate.

In some embodiments, the method further includes a step of removing the second protection layer before attaching the cover plate to the base substrate on which the display element is provided.

In some embodiments, the first protection layer and the second protection layer are removed simultaneously.

In some embodiments, the display substrate includes a bonding side, and includes a display region and a bonding region which is located at an end of the display substrate proximal to the bonding side; and the step of forming a first protection layer at at least one of outer peripheral sides of the base substrate includes a step of forming the first protection layer on at least a portion of each of two outer peripheral sides of the base substrate adjacent to the bonding side.

In some embodiments, the step of forming a first protection layer at at least one of outer peripheral sides of the base substrate includes a step of forming the first protection layer on at least a portion, which corresponds to the display region, of each of two outer peripheral sides of the base substrate adjacent to the bonding side.

In some embodiments, the step of forming a first protection layer at at least one of outer peripheral sides of the base substrate further includes a step of forming the first protection layer at an outer peripheral side opposite to the bonding side.

In some embodiments, the step of forming a first protection layer at at least one of outer peripheral sides of the base substrate includes a step of forming the first protection layer at all of the outer peripheral sides of the base substrate.

In some embodiments, a hardness of the first protection layer is smaller than a hardness of the base substrate.

In some embodiments, the display element includes a buffer layer, and a hardness of the first protection layer is smaller than a hardness of the buffer layer.

In some embodiments, the first protection layer is formed by a coating process.

According to another aspect of the present disclosure, there is provided a display substrate, which includes a base substrate;

a display element on the base substrate; and a first protection layer at at least one of outer peripheral sides of the base substrate;

wherein the first protection layer is configured to be removed before attaching a cover plate to the base substrate on which the display element is provided.

In some embodiments, the display substrate further includes a second protection layer on a side of the display element distal to the base substrate;

wherein the second protection layer is configured to be removed before attaching the cover plate to the base substrate on which the display element is provided.

In some embodiments, the display substrate further includes a bonding side, and includes a display region and a bonding region, wherein the bonding region is located at an end of the display substrate proximal to the bonding side; and the first protection layer is on at least a portion of each of two outer peripheral sides of the base substrate adjacent to the bonding side.

In some embodiments, the first protection layer is on at least a portion, which corresponds to the display region, of each of two outer peripheral sides of the base substrate adjacent to the bonding side.

In some embodiments, the first protection layer is at an outer peripheral side opposite to the bonding side.

In some embodiments, the first protection layer is at all of the outer peripheral sides of the base substrate.

In some embodiments, each of the first protection layer and the second protection layer is made of an ultraviolet light curable adhesive.

In some embodiments, the base substrate is a flexible base substrate.

DETAILED DESCRIPTION

To enable one of ordinary skill in the art to better understand technical solutions of the present disclosure, the present disclosure will be further described below in detail with reference to the accompanying drawings and specific embodiments.

The inventors of the present disclosure found that in the related art, a crack is generally prevented from extending by providing a blocking structure, but this method cannot prevent the crack from occurring. Thus, small cracks still occur in a display substrate such as an OLED display substrate, resulting in a poor display effect of the finally manufactured display panel.

According to an aspect of the present disclosure, a method for manufacturing a display substrate is provided. As shown in FIGS. 1 to 6, the display substrate includes a base substrate 2 and a display element, and the display element is provided on the base substrate 2.

Figure 2:
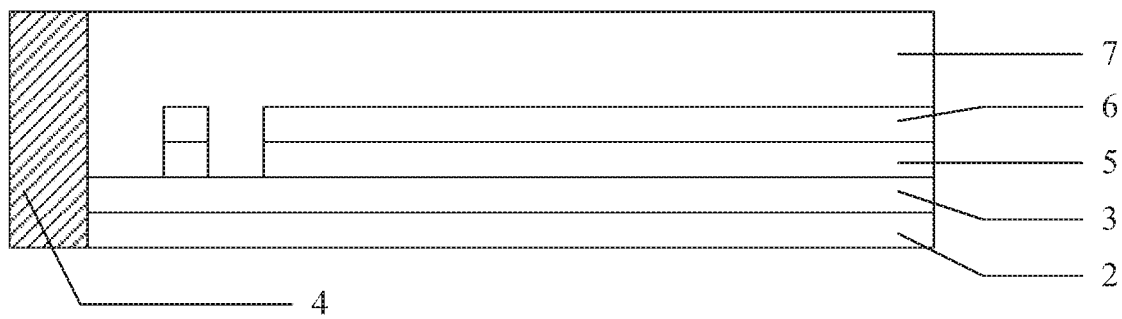
FIG. 2 is a schematic sectional view showing a display substrate according to an exemplary embodiment of the present disclosure, wherein a first protection layer is located only at an outer peripheral side of the display substrate.

In an exemplary embodiment of the present disclosure, the display substrate may be an OLED display substrate or a liquid crystal display substrate, and is not specifically limited herein. As shown in FIG. 2, the display element may include a buffer layer 3 provided on the base substrate 2, a gate insulation (GI) layer 5 provided on the buffer layer 3 (on a side of the buffer layer 3 distal to the base substrate 2), an interlayer insulation (ILD) layer 6, and the like. It should be noted that, the display element may further includes other layers such as a source and/or drain electrode layer, a planarization layer, a pixel definition layer, and a spacer layer. For the sake of simplicity, only the buffer layer 3, the gate insulation layer 5 and the interlayer insulation layer 6 are shown in FIG. 2.

Figure 1:
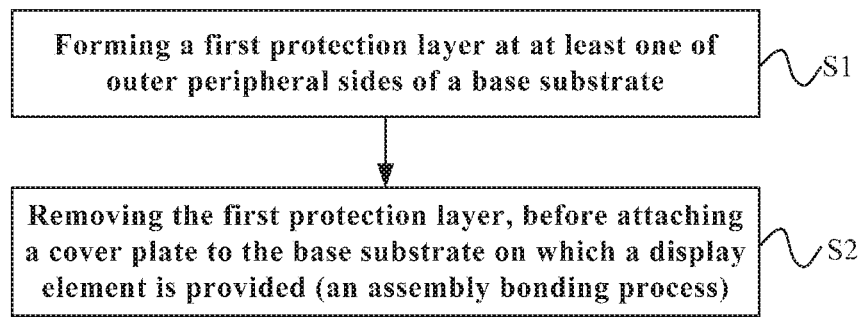
FIG. 1 is a schematic flowchart showing a method for manufacturing a display substrate according to an exemplary embodiment of the present disclosure.

As shown in FIG. 1, the method for manufacturing a display substrate provided by the present disclosure may include the following steps S1 and S2.

At step S1, a first protection layer 4 is formed at at least one of the outer peripheral sides of the base substrate 2.

As shown in FIG. 2, the base substrate 2 on which the display element is formed is a layer structure having a certain thickness. In an exemplary embodiment of the present disclosure, the first protection layer 4 is formed on at least one of the outer peripheral sides of the base substrate 2, i.e., the first protection layer 4 is formed on at least a portion of the outer periphery of the base substrate 2. That is, in an exemplary embodiment of the present disclosure, at least a portion of lateral sides of the base substrate 2 is covered by the first protection layer 4 to prevent the base substrate 2 from being in direct contact with the outside. When the display substrate is subjected to an external shock, the first protection layer 4 may buffer the external shock to a certain degree, thereby reducing the influence of the outside on the base substrate 2, and largely preventing a crack from occurring in the base substrate 2.

In an exemplary embodiment of the present disclosure, the first protection layer 4 may be formed by a coating process.

In an exemplary embodiment of the present disclosure, a hardness of the first protection layer 4 may be smaller than a hardness of the base substrate 2. That is, the first protection layer 4 with a smaller hardness is employed to enhance the buffering effect on an external shock, such that the influence of the external shock on the base substrate 2 is minimized, and a crack is prevented from occurring in the base substrate 2. In an exemplary embodiment, when the display element includes the buffer layer 3, the hardness of the first protection layer 4 is smaller than a hardness of the buffer layer 3, such that the first protection layer 4 may be employed to protect the buffer layer 3 effectively, and a crack is prevented from occurring in the buffer layer 3 largely.

Figure 4:
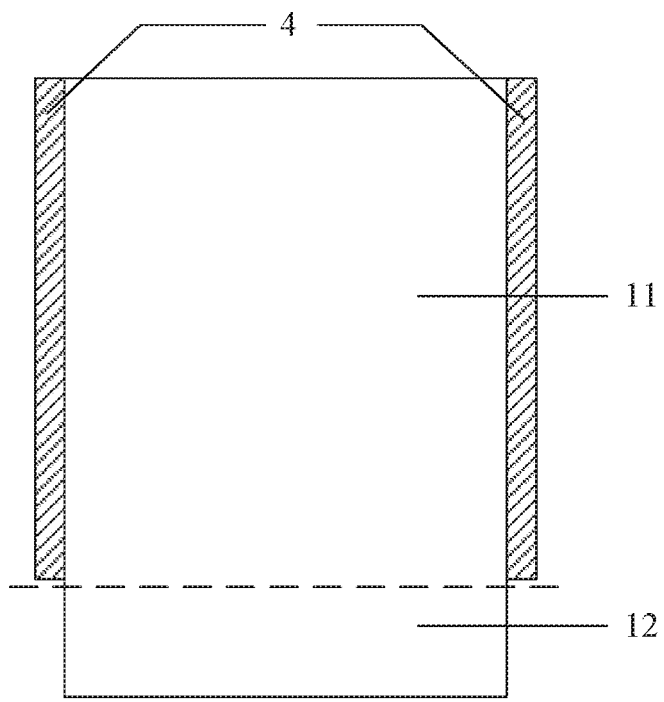
FIG. 4 is a schematic top view showing a display substrate according to an exemplary embodiment of the present disclosure, wherein a first protection layer is provided according to an arrangement manner.
Figure 5:
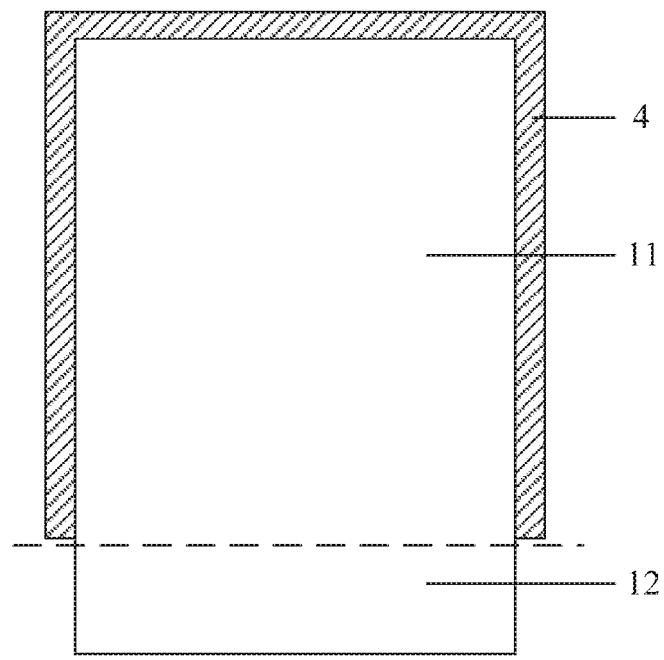
FIG. 5 is a schematic top view showing a display substrate according to an exemplary embodiment of the present disclosure, wherein a first protection layer is provided according to another arrangement manner.
Figure 6:
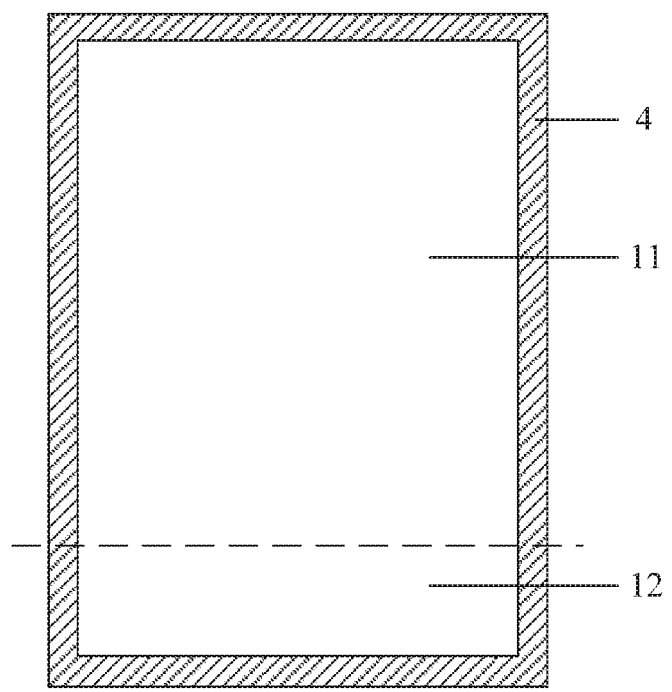
FIG. 6 is a schematic top view showing a display substrate according to an exemplary embodiment of the present disclosure, wherein a first protection layer is provided according to still another arrangement manner.

In an exemplary embodiment of the present disclosure, as shown in FIGS. 4 to 6, the display substrate includes a bonding side, and includes a display region 11 and a bonding region 12, the bonding region 12 being located at an end of the display substrate proximal to the bonding side. The step S1 may include forming the first protection layer 4 on at least a portion of each of the two outer peripheral sides adjacent to the bonding side.

In an exemplary embodiment of the present disclosure, the bonding region 12 is employed to bond devices such as a driver chip, a flexible printed circuit (FPC), and the like. The bonding side refers to a lateral side of an end of the display substrate proximal to the bonding region 12. The bonding side corresponds to the bonding region 12. Specifically, as shown in FIG. 4, a shape of the display substrate is generally a rectangle, and the bonding region 12 is usually located at a side (e.g., the lower side as shown in FIG. 4) of the display substrate that is short, and the short side is the bonding side.

In an exemplary embodiment of the present disclosure, the first protection layer 4 may be formed on at least a portion of each of the two outer peripheral sides adjacent to the bonding side. More specifically, as shown in FIG. 4, the first protection layer 4 is formed on at least a portion of each of the two outer peripheral sides of the base substrate 2 which are adjacent to the bonding side. In a practical application, since the two sides adjacent to the bonding side are most susceptible to an external shock, the first protection layer 4 is formed at both of the two sides to prevent a crack from occurring in the base substrate 2, according to the present exemplary embodiment.

In an exemplary embodiment of the present disclosure, the first protection layer 4 may be formed on at least a portion, which corresponds to the display region, of each of the two outer peripheral sides adjacent to the bonding side. As shown in FIG. 4, of each of the two sides of the base substrate 2 and the display element adjacent to the bonding side, a portion corresponds to the display region 11, and a portion corresponds to the bonding region 12. Since only a crack in the display region 11 degrades the display effect, and since the portion corresponding to the display region 11 is closer to the display region 11 than the portion corresponding to the bonding region 12, if a crack occurs in the portion corresponding to the display region 11, it is easier for the crack to extend to the display region 11. Thus, the first protection layer 4 is formed on a portion, which corresponds to the display region 11, of each of the two outer peripheral sides adjacent to the bonding side, in the present exemplary embodiment.

In an exemplary embodiment of the present disclosure, the first protection layer 4 may be formed further at a side not adjacent to the bonding side. Although the side not adjacent to the bonding side is less likely to be subjected to an external shock than the two sides adjacent to the bonding side, there is still a possibility that the side not adjacent to the bonding side is subjected to an external shock. Further, the side not adjacent to the bonding side generally has a small distance from the display region. Thus, as shown in FIG. 5, in an exemplary embodiment of the present disclosure, the first protection layer 4 may be formed further at the side not adjacent to (i.e., the side opposite to) the bonding side (e.g., the upper side in FIG. 5), thereby further preventing a crack from occurring in both of the base substrate 2 and the display element.

In an exemplary embodiment of the present disclosure, the first protection layer 4 may be formed at all of the outer peripheral sides of the base substrate 2. As shown in FIG. 6, the first protection layer 4 covers all of the outer peripheral areas of the base substrate 2 and/or the display element, completely prevent the base substrate 2 and/or the display element from being in direct contact with the outside, and achieves all-round protection to avoid the occurrence of a crack.

In an exemplary embodiment of the present disclosure, the method for manufacturing a display substrate may further include forming a second protection layer 7, which covers the display element, on the base substrate 2, before the step S1. As shown in FIG. 2, the second protection layer 7 may be formed on the side of the base substrate 2 at which the display element is provided, to protect the base substrate 2 and the display element thereon. Specifically, first the second protection layer 7 may be formed on a motherboard of the base substrate 2 provided with the display element thereon, next the motherboard is cut, and then the first protection layer 4 is formed on a lateral side of the base substrate 2.

At step S2, the first protection layer 4 is removed before a cover plate is attached to the base substrate 2 on which the display element is formed (i.e., before an assembly bonding process).

Figure 3:
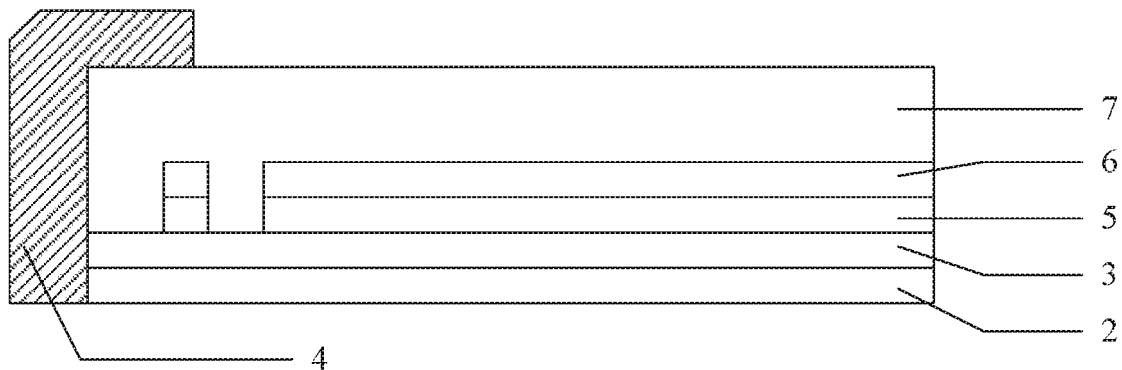
FIG. 3 is a schematic sectional view showing a display substrate according to an exemplary embodiment of the present disclosure, wherein a first protection layer is located at both an outer peripheral side and a top surface of the display substrate.

In an exemplary embodiment of the present disclosure, the first protection layer 4 is made of a material that may be removed by a removing (e.g., stripping off or peeling off) process. Since the base substrate 2 has a small thickness, as shown in FIG. 3, when the first protection layer 4 is formed by a coating process, it is easy to form the first protection layer 4 on the other surface (e.g., a top surface or a non-lateral side) of the base substrate 2, which will degrade the effect of an assembly bonding process. Therefore, the first protection layer 4 may be made of a removable (peelable or strippable) material, and during a time period from a stage of cutting the display substrate to a stage of bonding the components to form an assembly, the first protection layer 4 may protect the display substrate when the display substrate is cut, and during bonding the components, the first protection layer 4 may be removed so as not to affect the manufacturing process of the display panel. Nevertheless, even if the first protection layer 4 is formed only at lateral sides of the base substrate 2 and will not affect an assembly bonding process, the first protection layer 4 will increase the size of the display substrate if it is not removed, which is disadvantageous for the display device to have a narrow border and a light weight.

In an exemplary embodiment of the present disclosure, the first protection layer 4 may be made of an ultraviolet (UV) light curable adhesive. It should be noted that, the first protection layer 4 may also be made of other materials, as long as the formed first protection layer 4 may be removed by a certain process, and may protect the base substrate 2 and the display element without affecting the manufacturing process of the display panel. Further description of a material of the first protection layer 4 is omitted here.

In an exemplary embodiment of the present disclosure, the method for manufacturing a display substrate may further include removing (peeling off or stripping off) the second protection layer 7 before the cover plate is attached to the base substrate 2 on which the display element is formed. Similar to the first protection layer 4, the second protection layer 7 may also be made of a removable (peelable or strippable) material. The second protection layer 7 may protect the display substrate before the components are bonded to form an assembly. When an assembly bonding process is to be performed, the second protection layer 7 may be removed by a removing process so as not to affect the display substrate. Similar to the first protection layer 4, the second protection layer 7 may also be made of an ultraviolet light curable adhesive.

In an exemplary embodiment of the present disclosure, the first protection layer 4 and the second protection layer 7 may be removed simultaneously. That is, the first protection layer 4 and the second protection layer 7 may be removed by one removing process, thereby simplifying the manufacturing process of the display substrate.

According to another aspect of the present disclosure, a display substrate is provided. As shown in FIGS. 2 to 6, the display substrate may be manufactured by the method for manufacturing a display substrate, as described above. The display substrate may include the base substrate 2 and the display element, and the display element is provided on the base substrate 2.

In an exemplary embodiment of the present disclosure, the display substrate may be an OLED display substrate or a liquid crystal display substrate, and is not specifically limited herein. As described above, the display element may include the buffer layer 3 provided on the base substrate 2, the gate insulation (GI) layer 5 provided on the buffer layer 3 (e.g., at the side of the buffer layer 3 distal to the base substrate 2), the interlayer insulation (ILD) layer 6, and the like.

In an exemplary embodiment of the present disclosure, the first protection layer 4 is provided at at least one of the outer peripheral sides of the base substrate 2, and configured to be removed before the cover plate is attached to the base substrate 2 on which the display element is formed. Thus, during a time period from the stage of cutting the display substrate to the stage of the assembly bonding stage, when the display substrate is cut the first protection layer 4 may protect the display substrate, and when the components are bonded to form an assembly, the first protection layer 4 may be removed so as not to affect the manufacturing process of the display panel.

In an exemplary embodiment of the present disclosure, the base substrate may be provided with the second protection layer 7 covering the display element, and the second protection layer 7 may be configured to be removed before attaching the cover plate to the base substrate 2 on which the display element is formed. Similar to the first protection layer 4, the second protection layer 7 may protect the display substrate and may not affect the manufacturing process of the display panel.

In an exemplary embodiment of the present disclosure, both the first protection layer 4 and the second protection layer 7 may be made of an ultraviolet light curable adhesive.

In an exemplary embodiment of the present disclosure, the base substrate 2 may be a flexible base substrate 2, such as a flexible OLED display substrate. Although the flexible base substrate 2 may be made of a flexible material, a crack may occur in some structures thereof due to an external shock, so it is necessary to provide the first protection layer 4 on a lateral side thereof, to avoid the occurrence of a crack. In an exemplary embodiment of the present disclosure, at least a portion of the lateral sides of the base substrate 2 is covered by the first protection layer 4 to prevent the base substrate 2 from being in direct contact with the outside. When the display substrate is subjected to an external shock, the first protection layer 4 may buffer the external shock to a certain degree, thereby reducing the influence of the outside on the base substrate 2, and preventing a crack from occurring in the base substrate 2 largely.

It should be noted that for other aspects of the display substrate, reference may be made to the above detailed description of the method for manufacturing a display substrate.

It should be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. A method for manufacturing a display substrate, the display substrate comprising a base substrate and a display element provided on the base substrate, the method comprising steps of
    forming a first protection layer on at least one of outer peripheral sides of the base substrate, wherein the display substrate is a rectangle, and a lengthwise direction of the first protection layer is parallel to a lengthwise direction of the display substrate; and
    removing the first protection layer before an assembly bonding process,
    wherein a hardness of the first protection layer is smaller than a hardness of the base substrate.

2. The method according to claim 1, further comprising a step of
    forming a second protection layer, which covers the display element, on the base substrate, before the step of forming the first protection layer on at least one of outer peripheral sides of the base substrate.

3. The method according to claim 2, further comprising a step of
    removing the second protection layer before the assembly bonding process.

4. The method according to claim 3, wherein
    the first protection layer and the second protection layer are removed simultaneously.

5. The method according to claim 1, wherein
    the display substrate comprises a bonding side, and comprises a display region and a bonding region which is located at an end of the display substrate proximal to the bonding side; and
    the step of forming the first protection layer on least one of outer peripheral sides of the base substrate comprises a step of
    forming the first protection layer on at least a portion of each of two outer peripheral sides of the base substrate adjacent to the bonding side.

6. The method according to claim 5, wherein
    the step of forming the first protection layer on least one of outer peripheral sides of the base substrate comprises a step of
    forming the first protection layer on at least a portion, which corresponds to the display region, of each of two outer peripheral sides of the base substrate adjacent to the bonding side.

7. The method according to claim 1, wherein the display element comprises a buffer layer, and a hardness of the first protection layer is smaller than a hardness of the buffer layer.

8. The method according to claim 1, wherein
    the first protection layer is formed by a coating process.

* * * * *